US009548765B2

(12) United States Patent
Hwang et al.

(10) Patent No.: US 9,548,765 B2
(45) Date of Patent: Jan. 17, 2017

(54) TRANSMITTING APPARATUS AND RECEIVING APPARATUS AND CONTROL METHOD THEREOF

(71) Applicant: SAMSUNG ELECTRONICS CO., LTD., Suwon-si (KR)

(72) Inventors: Sung-hee Hwang, Suwon-si (KR); Hyun-koo Yang, Seoul (KR); Hak-ju Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 244 days.

(21) Appl. No.: 14/176,519

(22) Filed: Feb. 10, 2014

(65) Prior Publication Data
US 2014/0375890 A1 Dec. 25, 2014

(30) Foreign Application Priority Data

Jun. 25, 2013 (KR) ........................ 10-2013-0073222

(51) Int. Cl.
H04J 3/24 (2006.01)
H03M 13/00 (2006.01)
H04N 21/2383 (2011.01)
H04N 21/438 (2011.01)
H03M 13/11 (2006.01)
H03M 13/15 (2006.01)
H03M 13/25 (2006.01)
H03M 13/27 (2006.01)

(52) U.S. Cl.
CPC ..... H03M 13/6552 (2013.01); H04N 21/2383 (2013.01); H04N 21/4382 (2013.01); H03M 13/1165 (2013.01); H03M 13/152 (2013.01); H03M 13/255 (2013.01); H03M 13/27 (2013.01)

(58) Field of Classification Search
CPC ...... H04N 5/38; H04N 21/236; H04N 21/434; H04N 21/4382; H04N 21/6112
USPC ........................................................ 370/474
See application file for complete search history.

(56) References Cited

U.S. PATENT DOCUMENTS

| 8,385,238 | B2 | 2/2013 | Song et al. |
| 2010/0226426 | A1 | 9/2010 | Tupala et al. |
| 2010/0262708 | A1 | 10/2010 | Bouazizi et al. |
| 2011/0019101 | A1 | 1/2011 | Goto et al. |
| 2011/0167464 | A1 | 7/2011 | Yun et al. |

(Continued)

FOREIGN PATENT DOCUMENTS

KR 10-2011-0005645 A 1/2011

OTHER PUBLICATIONS

International Search Report for PCT/KR2014/005629 dated Oct. 2, 2014 [PCT/ISA/210].

(Continued)

Primary Examiner — Kan Yuen
(74) Attorney, Agent, or Firm — Sughrue Mion, PLLC

(57) ABSTRACT

A transmitting apparatus is provided. The transmitting apparatus includes: a frame generator configured to generate a first frame provided for a fixed terminal and a second frame provided for a mobile terminal, the second frame including common service data commonly provided for the fixed terminal and the mobile terminal; an information inserting unit configured to insert access information on the common service data into a signaling area of the first frame; and a transmitter configured to transmit the first and second frames.

16 Claims, 10 Drawing Sheets

(56) References Cited

U.S. PATENT DOCUMENTS

2012/0300690 A1 11/2012 Vare et al.
2015/0181277 A1* 6/2015 Kobayashi ......... H04N 21/4263
                                                           725/131

OTHER PUBLICATIONS

Written Opinion for PCT/KR2014/005629 dated Oct. 2, 2014 [PCT/ISA/237].

* cited by examiner

TRANSMITTING APPARATUS AND RECEIVING APPARATUS AND CONTROL METHOD THEREOF

CROSS-REFERENCE TO RELATED APPLICATION

This application claims priority from Korean Patent Application No. 10-2013-0073222, filed on Jun. 25, 2013, in the Korean Intellectual Property Office, the disclosure of which is incorporated herein by reference in its entirety.

BACKGROUND

1. Field

Apparatuses and methods consistent with exemplary embodiments relate to transmitting service data for a fixed terminal and a mobile terminal.

2. Description of the Related Art

The existing ground wave broadcasting physical specification organizations such as Digital Video Broadcasting (DVB) and Advanced Television Systems Committee (ATSC) have designed physical specifications for a fixed terminal as a receiving environment, or a mobile terminal as a receiving environment. Examples of the fixed terminal are a home smart television (TV), a set-top-box, etc. A typical example of the mobile terminal is a smartphone.

With further development of mobile networks and increasing distribution of smartphones, etc., there is a rising necessity to have an enhanced ground wave broadcasting physical specification covering mobile broadcasting. Also, high definition (HD) content services which have only been available via home TV become available via a mobile terminal due to development of network and display. Accordingly, a demand for a broadcasting physical frame enabling more efficient service transmission in view of both fixed broadcasting and mobile broadcasting has emerged.

SUMMARY

One or more exemplary embodiments provide a transmitting apparatus which includes and transmits common service data commonly directed to a fixed terminal and a mobile terminal in a frame provided for a mobile terminal only. One or more exemplary embodiments also provide a receiving apparatus and a control method with regard to this common service data.

According to an aspect of an exemplary embodiment, there is provided a transmitting apparatus which may include: a frame generator configured to generate a first frame provided for a fixed terminal receiving environment and a second frame provided for a mobile terminal receiving environment, the second frame including common service data commonly provided for both of the fixed and mobile terminal environments; an information inserting unit configured to insert access information on the common service data into a signaling area of the first frame; and a transmitter configured to transmit the first and second frames.

Herein, the access information may be information used to access the common service data through a signaling area of the second frame.

In this case, the access information may include identification information on the common service data and location information on the common service data, wherein the signaling area of the second frame may include signal processing information on the common service data.

The signal processing information may include at least one of forward error correction information and modulation method information.

The access information may be information used to directly access the common service data.

In this case, the access information may include identification information on the common service data, location information on the common service data, and signal processing information on the common service data.

Or, the access information may be included in at least one of a signaling area of the first frame and a signaling area of the second frame.

Herein, the transmitting apparatus may be realized as a Digital Video Broadcasting-Second Generation Terrestrial (DVB-T2) transmission system, wherein the first frame may be realized as a T2-Frame, and the second frame may be realized as a T2-Lite Frame.

According to an aspect of an exemplary embodiment, there is provided a control method of a transmitting apparatus which may include: generating a first frame provided for a fixed terminal and a second frame provided for a mobile terminal, the second frame including common service data commonly provided for the fixed terminal and the mobile terminal; inserting access information on the common service data into a signaling area of the first frame; and transmitting the first and second frames.

Herein, the access information may be information used to access the common service data through a signaling area of the second frame.

In this case, the access information may include identification information on the common service data and location information on the common service data, wherein the signaling area of the second frame may include signal processing information on the common service data.

In this case, the signal processing information may include at least one of forward error correction information and modulation method information.

Or, the access information may be information used to directly access the common service data.

In this case, the access information may include identification information on the common service data, location information on the common service data, and signal processing information on the common service data.

Or, the access information may be included in at least one of a signaling area of the first frame and a signaling area of the second frame.

Herein, the transmitting apparatus may be realized as a DVB-T2 transmission system, wherein the first frame may be realized as a T2-Frame, and the second frame may be realized as a T2-Lite Frame.

According to an aspect of an exemplary embodiment, there is provided a receiving apparatus which may include: a receiver configured to receive a first frame comprising service data provided for a fixed terminal and a second frame comprising service data provided for a mobile terminal and common service data commonly provided for the fixed terminal and the mobile terminal; and a demodulator configured to extract access information on the common service data included in a signaling area of the first frame and demodulate the common service data by using the extracted access information.

In this case, the access information may be information used to access the common service data referring to a signaling area of the second frame or directly access the common service data without referring to the signaling area of the second frame.

According to an aspect of an exemplary embodiment, there is provided a control method of a receiving apparatus which may include: receiving a first frame comprising service data provided for a fixed terminal and a second frame comprising service data provided for a mobile terminal and the common service data commonly provided for the fixed terminal and the mobile terminal; and extracting access information on the common service data included in a signaling area of the first frame, and demodulating the common service data by using the extracted access information.

Herein, the access information may be used to access the common service data referring to a signaling area of the second frame or directly access the common service data without referring to the signaling area of the second frame.

As described above, according to the exemplary embodiments, data transmission efficiency increases.

BRIEF DESCRIPTION OF THE DRAWINGS

The above and/or other aspects of the present inventive concept will be more apparent by describing certain exemplary embodiments of the present inventive concept with reference to the accompanying drawings, in which.

DESCRIPTION OF THE EXEMPLARY EMBODIMENTS

Figure 1A:
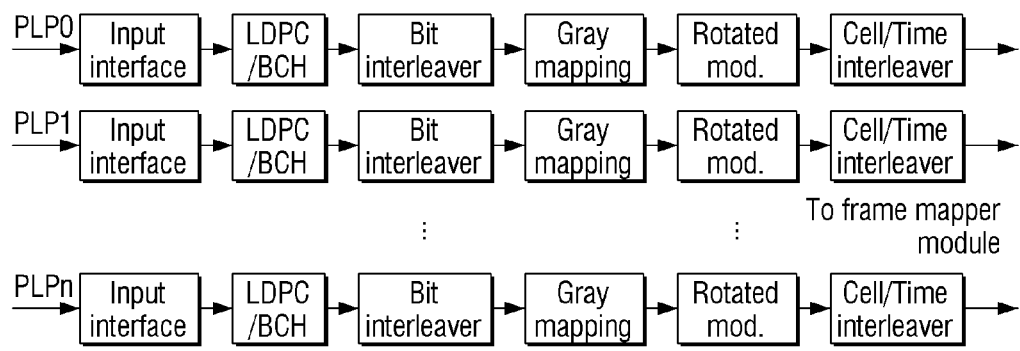
FIGS. 1A and 1B illustrate a Digital Video Broadcasting-Second Generation Terrestrial (DVB-T2) system and a frame structure transmitted through the DVB-T2 system, according to an exemplary embodiment.

Certain exemplary embodiments are described in higher detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. In the descriptions, well-known functions or constructions are not described in detail since they may only obscure the inventive concept with unnecessary detail.

Figure 1B:
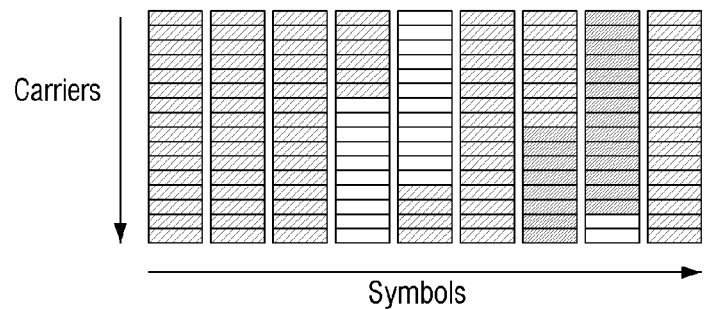

FIGS. 1A and 1B illustrate a Digital Video Broadcasting-Second Generation Terrestrial (DVB-T2) system and a frame structure transmitted through the DVB-T2 system, according to an exemplary embodiment.

The DVB-T2 system may transmit data through a T2-Frame and a T-2 Lite Frame proposed in the European Telecommunications Standards Institute (ETSI) EN 302 755 version 1.3.1 for a receiving environment (signal-to-noise ratio (SNR) 15 dB) of a fixed terminal and a receiving environment (SNR 5-10 dB) of a mobile terminal, respectively.

As to the DVB-T2 system, unlike a DVB-T system, as illustrated in FIG. 1A, a physical layer pipe (PLP) concept is applied such that various services with different modulation methods, channel encoding rates, times and cell interleaving lengths can be provided.

Herein, the PLP indicates a signal pathway independently processed. That is, different services, for example, video, expansion video, audio, data stream, etc., may be transceived through a plurality of RF channels, and the PLP is a pathway where such service is transmitted or a stream transmitted through the pathway. Moreover, the PLP may be located on slots which are disposed with time intervals on a plurality of RF channels, or may be disposed with time intervals on one RF channel. That is, one PLP may be disposed and transmitted with time intervals on one RF channel or a plurality of RF channels.

According to an exemplary embodiment, a PLP structure includes an input mode A providing one PLP and an input mode B providing a plurality of PLPs, more particularly, when the input mode B is operative, a certain strengthened service may be provided, and also, by dividing one stream and transmitting the stream as shown in FIG. 1B, a length of time interleaving may be increased, and consequently a time diversity benefit can be obtained. In addition, power of a receiver may be turned on or off according to which stream is received, and thus low power consumption may be achieved. Accordingly, this PLP structure is suitable for providing portable or mobile broadcasting services.

Herein, the time diversity is a technology used in a mobile communication transmission pathway. That is, a transmitting side transmits the same signal several times in a certain time interval in order to reduce deterioration of a quality of transmission, and a receiving side receives the signal and synthesizes the signal to obtain a good quality of transmission.

In addition, by including information which can be commonly transmitted through a plurality of PLPs into one PLP, transmission efficiency can be improved. A PLP0 illustrated in FIG. 1 plays this role, wherein such PLP is called a common PLP, and the other PLPs can be used for transmitting data These PLPs are called data PLPs.

If this PLP structure is used, an HDTV program can be received at a home TV, and also, a standard definition TV (SDTV) program can be received at a device in motion such as a smartphone. In addition, through broadcasting stations or broadcasting content providers, various broadcasting services can be provided to viewers in different areas including a fringe area.

The European Telecommunications Standards Institute (ETSI) EN 302 755 version 1.3.1 introduces a T2-Lite profile. The T2-Lite profile, like mobile broadcasting, is to realize a service provided for a mobile receiver. The T2-Lite, based on a limited subset of a T2-base profile mode, enables an efficient design of a receiver by avoiding a mode requiring complicatedness and memories.

T2-Lite enables a service to be received even in a fringe area where a service reception condition is bad, by making it possible to concurrently deliver different versions of the service having different bit rates and protection levels.

For example, a Future Extension Frame (FEF) defined in the DVB-T2 may transmit a T2-Lite Frame. In this case, the FEF may be processed with a demodulation parameter, such as an FFT size, a guard interval, a single frequency network (SFN)/multiple input single output (MISO), a pilot pattern, etc., which is different from T2-Frames in order to improve a performance of mobile receiving. An FEF interval and a size of a T2-Lite super frame may be defined in a T2 gateway. Further explanation on T2-Lite Frame will be omitted, as it is well known to an ordinary skill in this technology field.

Figure 2:
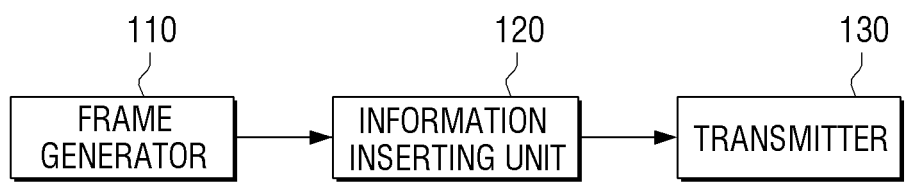
FIG. 2 is a block diagram illustrating a configuration of a transmitting apparatus which generates and transmits a plurality of frames including data for services, according to an exemplary embodiment.

FIG. 2 is a block diagram illustrating a configuration of a transmitting apparatus which generates and transmits a plurality of frames including data for services, according to an exemplary embodiment.

According to FIG. 2, a transmitting apparatus 100 includes a frame generating unit 110, an information inserting unit 120, and a transmitter 130.

The transmitting apparatus 100 may transmit to a receiving apparatus (not shown) data including service data provided for a fixed terminal and service data provided for a mobile terminal. Here, the service data provided for the fixed terminal and the service data provided for the mobile terminal may be directed to the same service. Further, the fixed terminal may include a home TV or set-top box, and the mobile terminal may include a smartphone.

The frame generating unit 110 generates a frame to be transmitted through the transmitting apparatus 100.

Specifically, the frame generating unit 110 may generate a frame which includes a first frame provided for a fixed terminal receiving environment and a second frame provided for a mobile terminal receiving environment. The frame may also include common service data, for example, an F/M common service, which is commonly provided for the fixed terminal and the mobile terminal, in a second frame. For example, if the transmitting apparatus 100 is realized as a DVB-T2 transmission system, the first frame may be a T2-Frame, and the second frame may be a T2-Lite Frame.

That is, service data provided for a fixed terminal is included in the T2-Frame, service data provided for a mobile terminal is included in the T2-Lite Frame, and common service data commonly provided for the fixed terminal and the mobile terminal is included in the T2-Lite Frame among the T2-Frame and the T2-Lite Frame. This is because a mobile channel environment, which is worse than a fixed channel environment in terms of data transmission, applies a low order modulation and a low code rate forward error correction (FEC) coding, and thus, data transmitted through a mobile PHY frame can be received in a fixed terminal receiving environment while data transmitted through a fixed PHY frame cannot be received in a mobile terminal receiving environment. For example, the mobile PHY frame transmits data by applying FEC, modulation, etc. considering a channel environment in 5 dB-10 dB, whereas the fixed PHY frame transmits data by applying FEC and modulation considering a 15 dB channel environment.

The information inserting unit 120 inserts access information on the common service data included in the second frame into a signaling area of the first frame, according to an exemplary embodiment.

Herein, the access information may be information used to access the common service data through a signaling area of the second frame, from the first frame, or information used to directly access the common service data included in the second frame, from the first frame.

According to an exemplary embodiment, if the access information is information used to access the common service data through the signaling area of the second frame, from the first frame, the access information may include identification (ID) information and location information on the common service data. That is, the access information may include the ID information on each common service data and information that the common service data are transmitted through the second frame. In this case, the signaling area of the second frame may include signal processing information about the common service data. For example, the signal processing information may include at least one of FEC information and demodulation method information on each common service data, but is not limited thereto. Accordingly, the common service data transmitted through the second frame can be accessed through the signaling area of the second frame.

According to another exemplary embodiment, if the access information is information used to access the common service data included in the second frame from the first frame, the access information may include the ID information, the location information, and the signal processing information on the common service data. For example, the access information may include ID information on each common service data, the information that the common service data is transmitted through the second frame, and the signal processing information on each common service data. Accordingly, the common service data transmitted through the second frame can be accessed without accessing the signaling area of the second frame.

According to still another exemplary embodiment, the access information may be included in the signaling area of the second frame. Thus, the common service data can be accessed through one of the signaling area of the first frame and the signaling area of the second frame.

According to an exemplary embodiment, detailed information including location information on all service data included in the first frame and the second frame may be included in the signaling area the first frame and the signaling area of the second frame, respectively. For example, the signaling area of the first frame may include information that service 1 to service 3 are transmitted through the first frame, and the signaling area of the second frame may include information that service 4 to service 6 are transmitted through the second frame.

The transmitter 130 has a function to transmit the first and the second frames to a receiving apparatus (not shown). According to an exemplary embodiment, the transmitter 130 may be realized as a transmission antenna.

Figure 3:
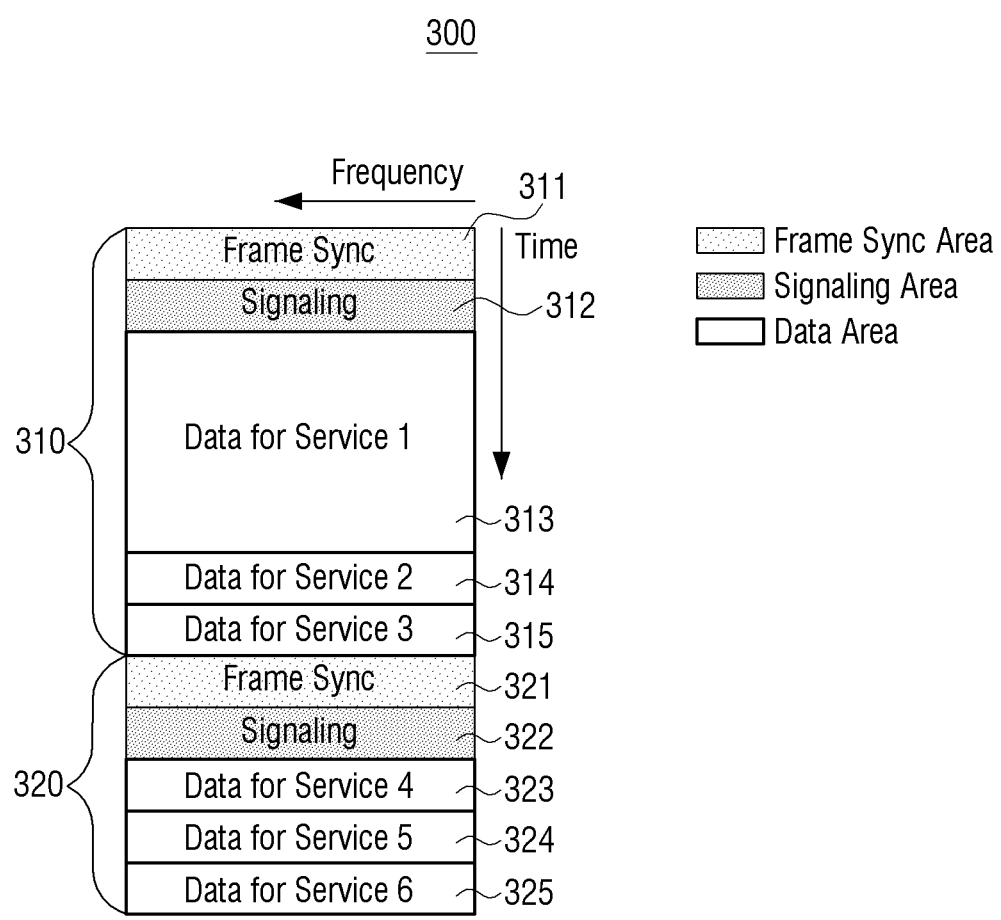
FIG. 3 illustrates a structure of a frame generated and transmitted by the transmitting apparatus of FIG. 2, according to an exemplary embodiment.

FIG. 3 illustrates a structure of a frame generated and transmitted by the transmitting apparatus of FIG. 2, according to an exemplary embodiment.

As illustrated in FIG. 3, the frame includes a first frame 310 for a fixed terminal and a second frame 320 for a mobile terminal. The first frame 310 may be a fixed PHY frame, and the second frame 320 may be a mobile PHY frame.

The first and second frames 310 and 320 include frame sync areas 311 and 321, signaling areas 312 and 322, and data areas 313-315 and 323-325, respectively. The data areas 313-315 and 323-325 include data for services 1-3 and data for services 4-6 provided for fixed and mobile terminals, respectively.

Here, the data for the services 4-5 may be common service data provided for a fixed terminal and a mobile terminal at the same time. These common service data are not transmitted through the first frame 310, but transmitted through the second frame 320, and thus, efficiency in data transmission may be improved.

The signaling area 312 of the first frame 310 may include and transmit access information which is used to obtain the common service data, i.e., the data for the services 4-5.

Meanwhile, the above-described exemplary embodiment is merely an example of a structure that a frame can have to include a signaling area. If a frame has a different structure, the access information can be included in a different area which performs a similar function as the signaling area 312 of the first frame 310.

Hereinbelow, the access information is described in detail with reference to drawings.

Figure 4:
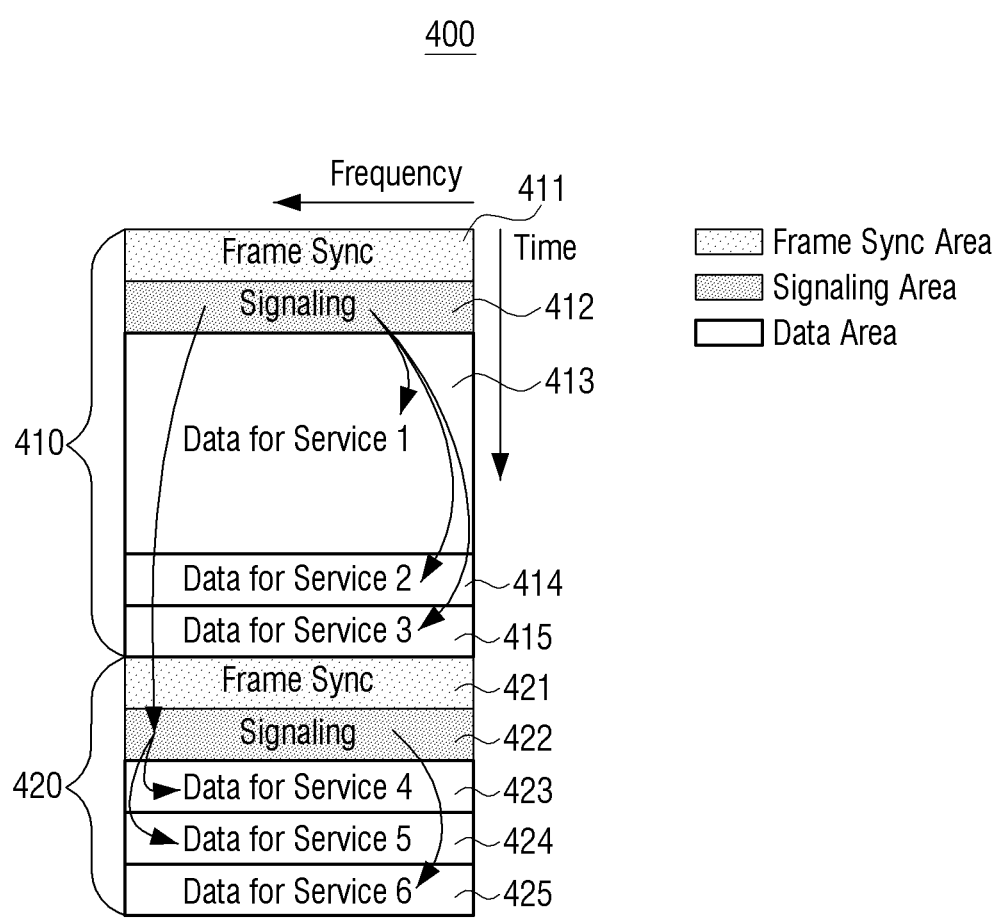
FIG. 4 illustrates how access information is used in a frame generated and transmitted by the transmitting apparatus of FIG. 2, according to an exemplary embodiment.

FIG. 4 illustrates how access information is used in a frame generated and transmitted by the transmitting apparatus of FIG. 2, according to an exemplary embodiment. The frame structure illustrated in FIG. 4 corresponds to the frame structure illustrated in FIG. 3. For example, access information included in a signaling area 412 corresponds to the access information included in the signaling area 312 of the first frame 310 in FIG. 3.

According to FIG. 4, the access information included in the signaling area 412 of a first frame 410 is used to access common service data, e.g., data for services 4-5, included in data area 423-424 of the second frame 420 through a signaling area 422 of the second frame 420.

Specifically, the signal area 412 of the first frame 410 may store ID information on the common service data, e.g., data for services 4-5, and information that the common service data are transmitted through the second frame 420, and the signaling area 422 of the second frame 420 may store detailed signal processing information, such as parameters for FEC and/or modulation, about the common service data. Here, data services 1-6 can be realized as the above-described PLPs.

Accordingly, through access information included in the signaling area 412 of the first frame 410, the common service data, e.g., the data for services 4-5, can be accessed via the signaling area 420 of the second frame 420.

Figure 5:
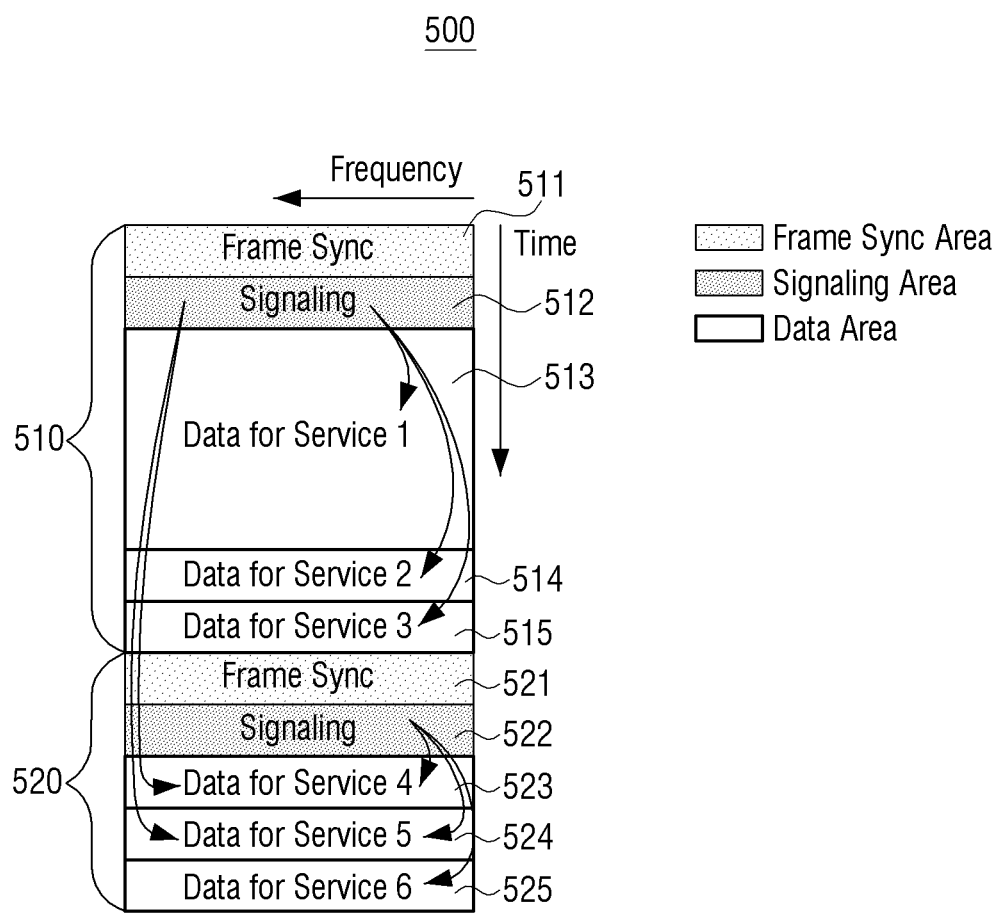
FIG. 5 illustrates how access information is used in a frame generated and transmitted by the transmitting apparatus of FIG. 2, according to another exemplary embodiment.

FIG. 5 illustrates how access information is used in a frame generated and transmitted by the transmitting apparatus of FIG. 2, according to another exemplary embodiment. The frame structure illustrated in FIG. 5 corresponds to the frame structure illustrated in FIG. 3.

According to FIG. 5, access information included in a signaling area 512 of a first frame 510 is used to access common service data, e.g., data for services 4-5, included in data area 523-524 of the second frame 520 not through a signaling area 522 of the second frame 520. That is, FIG. 5 illustrates that the access information included in the signaling area 512 of the first frame is used to directly access the common service data included in the second frame 520.

Specifically, the signal area 512 of the first frame 510 may store ID information on the common service data, e.g., data for services 4-5, and information that the common service data are transmitted through the second frame 520. Further, the signaling area 512 of the first frame 510 may store detailed signal processing information, such as parameters for FEC and modulation, about the common service data. That is, the common service data transmitted through the second frame 520 can be accessed without accessing the signaling area 522 of the second frame 520.

Figure 6:
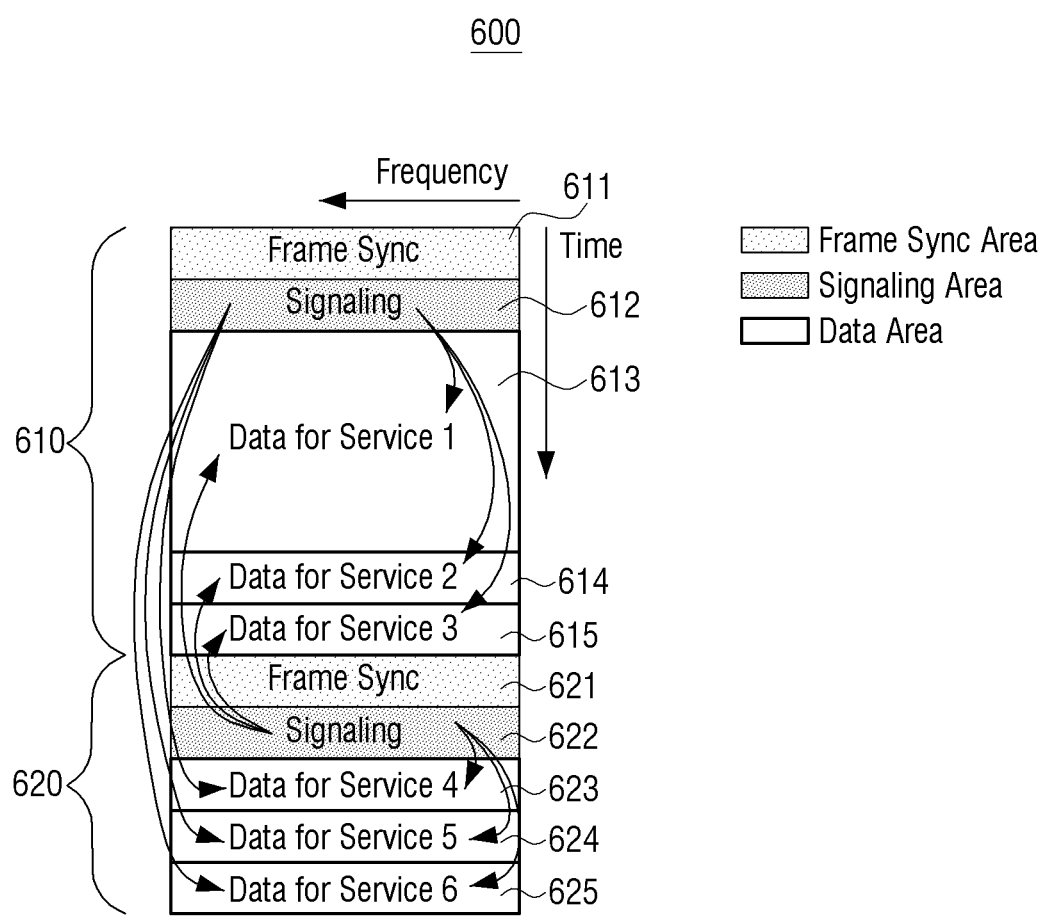
FIG. 6 illustrates how access information is used in a frame generated and transmitted by the transmitting apparatus of FIG. 2, according to still another exemplary embodiment.

FIG. 6 illustrates how access information is used in a frame generated and transmitted by the transmitting apparatus of FIG. 2, according to still another exemplary embodiment. The frame structure illustrated in FIG. 6 corresponds to the frame structure illustrated in FIG. 3.

According to FIG. 6, access information used to access common service data, e.g., data for services 4-5, included in data area of 623-624 of the second frame 620 is included not only in a signaling area 612 of the first frame 610 but also in a signaling area 622 of the second frame 620.

In other words, the signaling areas 612 and 622 of the first and second frames 610 and 620 may include detailed information on data for services 1-6. That is, regardless of a frame, when information included in the signaling areas is obtained, detailed information such as parameters for FEC and modulation about entire service data can be known.

Specifically, detailed information about the data for services 1-3 and the data for services 4-6 may be included in the signaling areas 612 and 622 of the first and second frame 610 and 620, respectively. Further, information that the data for services 1-3 are transmitted through the first frame 610, that is a fixed PHY frame, and information that the data for services 4-6 are transmitted through the second frame 620, that is a mobile PHY frame, may be included in the signaling areas 612 and 622, respectively.

Although not illustrated in FIG. 6, the detailed information about the data for services 1-3 may be included the signaling area 622 of the second frame 620 instead of the signaling area 612 of the first frame 610, according to an exemplary embodiment. Also, the detailed information about the data for services 4-6 may be included the signaling area 612 of the first frame 610 instead of the signaling area 622 of the second frame 620, according to another exemplary embodiment.

Figure 7:
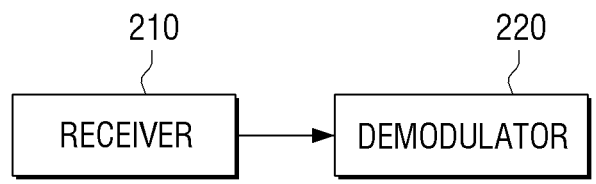
FIG. 7 is a block diagram illustrating the configuration of a receiving apparatus which receives a plurality of frames including data for services by the transmitting apparatus 100 illustrated in FIG. 2, according to an exemplary embodiment.

FIG. 7 is a block diagram illustrating the configuration of a receiving apparatus which receives a plurality of frames including data for services by the transmitting apparatus 100 illustrated in FIG. 2, according to an exemplary embodiment.

According to FIG. 7, the receiving apparatus 200 may include a receiver 210 and a demodulator 220.

The receiver 210 receives the data transmitted from the transmitting apparatus 100 illustrated in FIG. 2. Here, the receiver 210 may include a tuner.

Specifically, the receiver 210 may receive a first frame including service data provided for a fixed terminal, and a second frame including service data provided for a mobile terminal and common service data commonly provided for the fixed terminal and the mobile terminal.

The demodulator 220 extracts access information on the common service data included in a signaling area of the first frame, and demodulates the common service data by using the extracted access information. The access information is information used to directly access the common service data or access the common service data through a signaling area of the second frame.

Specifically, if the access information is information used to access the common service data through the signal area of the second frame, from the first frame, the access information may include ID information and location information that the common service data is transmitted through the second frame. In this case, the signaling area of the second frame may include signal processing information about the common service data.

In this case, the demodulator 220 may access the signaling area of the second frame through access information included in the signaling area of the first frame, and access the common service data transmitted through the second frame via signal processing information on the common service data included in the signaling area of the second frame.

If the access information is information used to directly access the common service data included in the second frame, from the first frame, the access information may include the ID information, the location information, and the signal processing information on the common service data. For example, the access information can include all the ID information on each common service data, that information that the common service data is transmitted through the second frame, and the signal processing information on each common service data.

In this case, the demodulator 220, through access information included in the signaling area of the first frame, can access the common service data transmitted through the second frame, without referring to the signaling area of the second frame.

The access information may also be included in the signaling area of the second frame. Thus, the demodulator 220 may access the common service data through one of the signaling area of the first frame and the signaling area of the second frame.

Figure 8A:
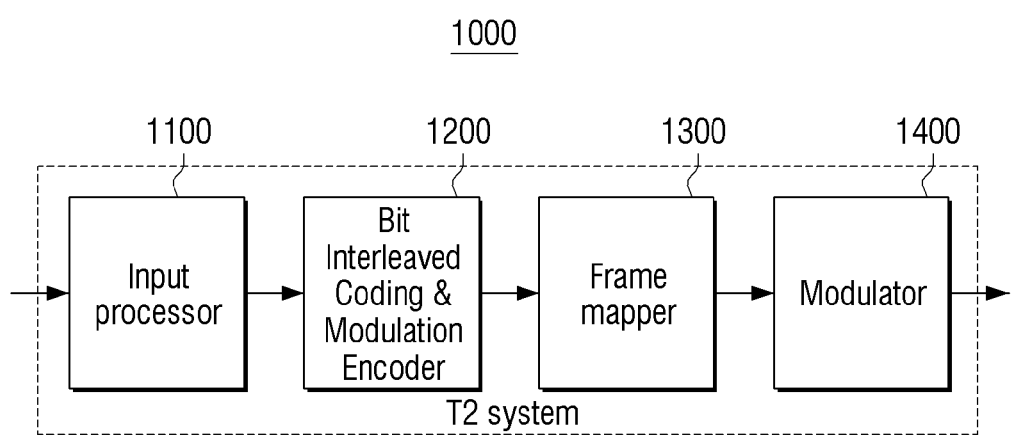
FIG. 8A is a block diagram illustrating a DVB-T2 transmission system 1000.
Figure 8B:
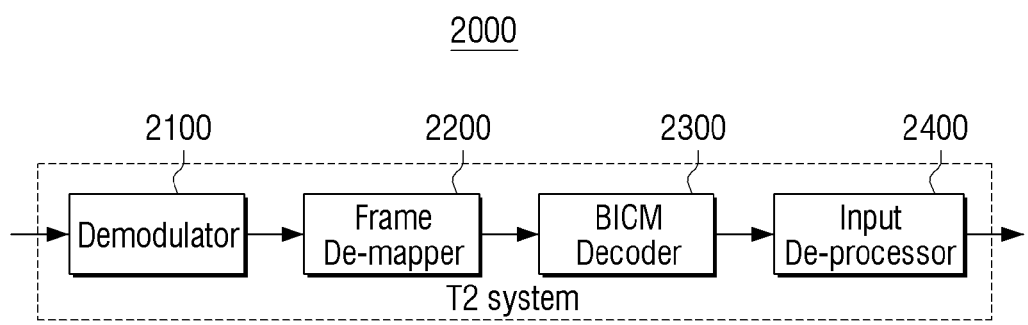
FIG. 8B is a block diagram illustrating a DVB-T2 transmission system 2000, according to an exemplary embodiment.

FIG. 8 is a block diagram illustrating a configuration of a DVB-T2 system, according to an exemplary embodiment. FIG. 8A is a block diagram illustrating a DVB-T2 transmission system 1000, and FIG. 8B is a block diagram illustrating a DVB-T2 transmission system 2000, according to an exemplary embodiment.

According to FIG. 8A, the DVB-T2 transmission system 1000 includes an input processor 1100, a bit interleaved coding and modulation (BICM) encoder 1200, a frame builder 1300, and a modulator 1400.

The DVB-T2 transmission system 1000 may correspond to a system described in in DVB-T2, which is one of the European digital broadcasting standards.

The input processor 1100 generates a baseband frame (BBFRAME) from an input stream of data to be serviced. The input stream may be at least one of a Moving Picture Experts Group (MPEG)-2 TS transport stream, a generic stream (GS), etc.

The BICM encoder 1200 determines an FEC coding rate and constellation order to perform encoding according to an area through which the data will be transmitted, that is, a fixed PHY frame or a mobile PHY frame. Moreover, the BCIM 1200 will perform encoding on signaling information about the data to be serviced.

The frame builder 1300 and modulator 1400 constitute a frame by determining an orthogonal frequency-division multiplexing (OFDM) parameter for a signaling area and an OFDM parameter for an area through which the data will be transmitted, and generates a frame by adding a sync area. In addition, the frame builder 1300 and modulator 1400 perform modulation to modulate the generated frame to a radio frequency (RF) signal, and transmit the RF signal to a receiver.

In the sync area, information which indicates whether a receiving frame is a mobile frame or a fixed frame is inserted. If the OFDM parameter for a signaling area or a data area on each frame is not pre-determined, information which indicates this, that is, the OFDM parameter for a signaling area and a data area is stored in the sync area and transmitted.

Meanwhile, generating a frame generated by the transmitting apparatus 100 as described in FIG. 2 may be performed by the input processor 1100.

According to FIG. 8B, a DVB-T2 receiving system 2000 may include a demodulator 2100, a frame de-mapper 2200, a BICM decoder 2300, and an input de-processor 2400.

The demodulator 2100 performs demodulation of a received RF signal according to the OFDM parameter. The demodulator also performs sync detection. If the sync area is detected, whether a mobile frame is received or a fixed frame is received is recognized from information stored in the sync area.

If the OFDM parameters for the signaling area and the data area are not predetermined, these OFDM parameters stored in the sync area are obtained to perform the demodulation.

The frame de-mapper 2200 inserts demodulated data for the signaling area to the BICM decoder 2300 for the signaling area.

The BICM decoder 2300 performs BICM decoding on the inserted data. The BICM decoder 2300 may perform the BICM decoding by using parameters for FEC and demodulation of data stored in each data area These parameters may be stored in the signaling area.

The input de-processor 2400 may generate the data to be serviced by processing the BBFRAME received from the BCIM decoder 2300.

Meanwhile, in the above-described exemplary embodiment, the receiving apparatus 2000 is described on an assumption that the receiving apparatus 2000 knows which data for a service a user is to receive. However, if the receiving apparatus 2000 does not know which data for a service a user is to receive, the receiving apparatus 2000 should recognize this. For example, if a user sets a TV channel to channel 6, the receiving apparatus 2000 receives a frame through the same process as the above-mentioned process to receive a frame, obtains service information such as program specific information/service information (PSI/SI) or program and system information protocol (PSIP) stored in a frame, and recognizes service data on channel 6.

Meanwhile, the demodulator 2100 may correspond to the demodulator 220 of the receiving apparatus 200 illustrated in FIG. 7.

Figure 9:
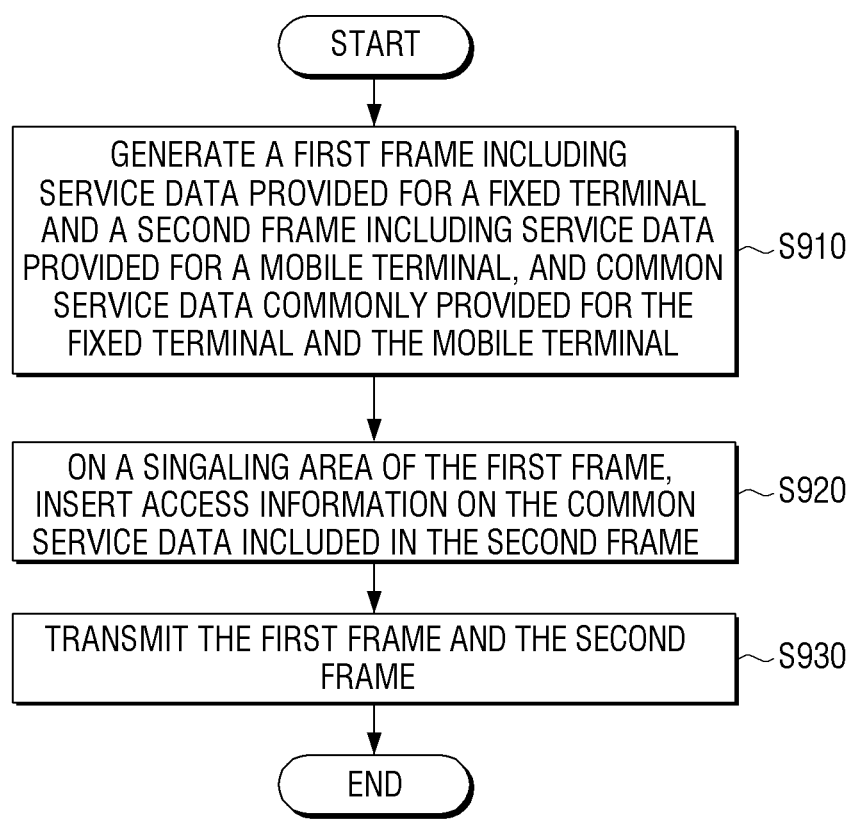
FIG. 9 is a flowchart describing a control method of a transmitting apparatus corresponding to the transmitting apparatus of FIG. 2, according to an exemplary embodiment.

FIG. 9 is a flowchart describing a control method of a transmitting apparatus corresponding to the transmitting apparatus of FIG. 2, according to an exemplary embodiment.

Referring to the control method of the transmitting apparatus illustrated in FIG. 9, a first frame which includes service data provided for a fixed terminal, and a second frame which includes service data provided for a mobile terminal are generated, and the second frame is generated also to include common service data provided commonly to the fixed terminal and the mobile terminal (S910). Here, the transmitting apparatus may be realized as a DVB-T2 transmitting system, the first frame may be a T2-Frame, and the second frame may be T2-Lite Frame.

Sequentially, access information on the common service data included in the second frame is included in a signaling area of the first frame (S920).

And then, the first frame and the second frame are transmitted (S930).

The access information according to an exemplary embodiment may be information used to access the common service data through the signaling area of the second frame.

In this case, the access information may include ID information and location information on the common service data, and the signaling area of the second frame may include signal processing information on the common service data. Here, the signal processing information may include at least one of FEC information and demodulation method information.

According to another exemplary embodiment, the access information may be information used to directly access the common service data without referring to the signaling area of the second frame.

In this case, the access information may include ID information, location information, and signal processing information on the common service data.

In some circumstances, the access information may be included not only in the signaling area of the first frame but also the signaling area of the second frame.

Figure 10:
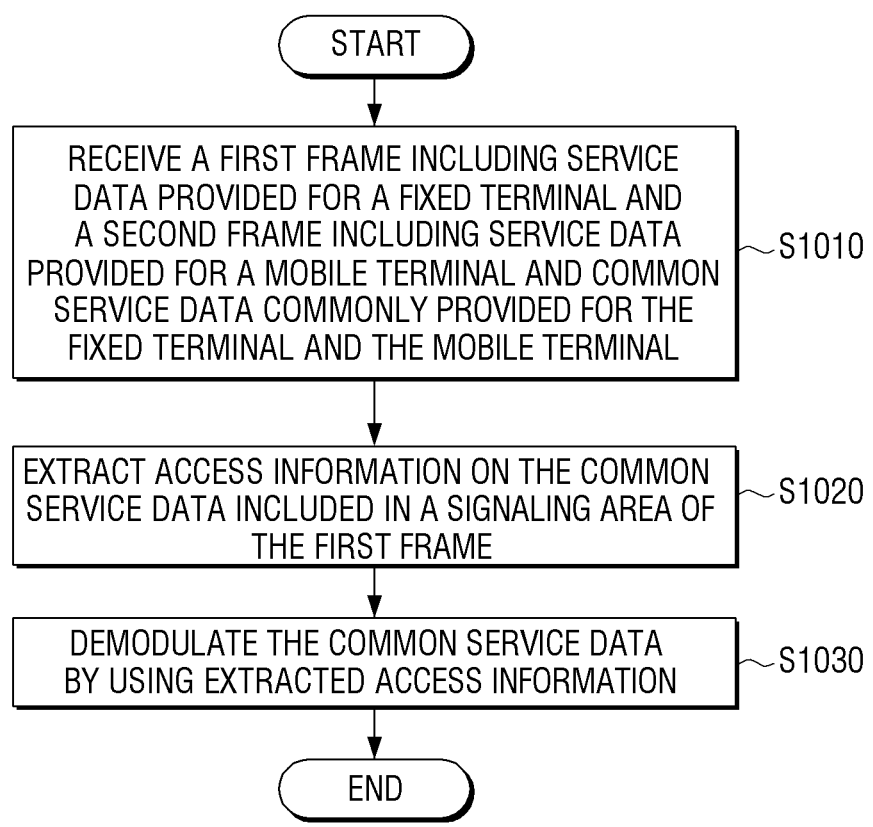
FIG. 10 is a flowchart describing a control method of a receiving apparatus corresponding to the receiving apparatus of FIG. 7, according to an exemplary embodiment.

FIG. 10 is a flowchart describing a control method of a receiving apparatus corresponding to the receiving apparatus of FIG. 7, according to an exemplary embodiment.

Referring to the control method of the receiving apparatus illustrated in FIG. 10, a first frame which includes service data provided for a fixed terminal and a second frame which includes service data provided for a mobile terminal and the common service data commonly provided for the fixed terminal and the mobile terminal are received (S1010). For example, the receiving apparatus may be realized as a DVB-T2 receiving system, the first frame may be a T2-Frame, and the second frame may be a T2-Lite Frame.

Sequentially, access information, included in a signaling area of the first frame, on common service data is extracted (S1020). Here, the access information may be information used to access the common service data through a signaling area of the second frame or information used to directly access the common service data.

And then, by using the extracted access information, the common service data is demodulated (S1030). As the method of demodulating the common service data by using the access information has been explained in FIGS. 2-7 in detail, further explanations will be omitted.

As described above, efficiency in data transmission is improved.

Meanwhile, the method of controlling the transmitting apparatus according to above-described various exemplary embodiments can be provided to a transmitting apparatus so that the method can be realized as a computer executable program code, stored in various non-transitory computer readable media, and executed by a processor.

As an example, there may be provided a non-transitory computer readable medium which stores a program which generates the first frame including service data provided for a fixed terminal and the second frame including service data provided for a mobile terminal and common service data commonly provided for the fixed terminal and the mobile terminal, and inserts access information used to access the common service data into a signaling area of the first frame.

A non-transitory computer readable medium indicates a medium which semi-permanently stores data and is readable with a device, different from a medium which stores data for a short time such as register, cache, etc. Specifically, the above-described various applications or programs may be stored and provided in a non-transitory computer readable medium such as compact disc (CD), digital versatile disc (DVD), hard disk, Blu-ray disk, universal serial bus (USB), memory card, read-only memory (ROM).

The block diagrams in FIGS. 2, 7, 9 and 10 illustrate apparatuses and methods according to the exemplary embodiments. In this regard, each block may represent a module, a program, or a part of code, which contains one or more executable instructions for performing specified logic functions. It should also be noted that block diagrams may be implemented by a dedicated hardware-based system for performing specified functions or operations, by a software-based system for performing specified functions or operations, or by a combination of dedicated hardware and computer instructions.

The foregoing embodiments and advantages are merely exemplary and are not to be construed as limiting the inventive concept. Also, the description of the exemplary embodiments of the present inventive concept is intended to be illustrative, and not to limit the scope of the claims, and many alternatives, modifications, and variations will be apparent to those skilled in the art.

What is claimed is:

1. A transmitting apparatus comprising:
at least one processor to implement:
a frame generator configured to generate a first frame comprising first service data to be decoded at a fixed terminal and a second frame comprising second service data to be decoded at a mobile terminal, the second frame comprising common service data commonly provided for the fixed terminal and the mobile terminal; and
an information inserting unit configured to insert access information on the common service data into a signaling area of the first frame; and
a transmitter configured to transmit the first and second frames.

2. The apparatus of claim 1, wherein the access information is used to access the common service data through a signaling area of the second frame.

3. The apparatus of claim 2, wherein the access information comprises identification information on the common service data and location information on the common service data, and
wherein the signaling area of the second frame comprises signal processing information on the common service data.

4. The apparatus of claim 3, wherein the signal processing information comprises at least one of forward error correction information and modulation method information.

5. The apparatus of claim 1, wherein the access information is used to directly access the common service data.

6. The apparatus of claim 5, wherein the access information comprises identification information on the common service data, location information on the common service data, and signal processing information on the common service data.

7. The apparatus of claim 5, wherein the access information is included in at least one of a signaling area of the first frame and a signaling area of the second frame.

8. The apparatus of claim 1, wherein the transmitting apparatus is a Digital Video Broadcasting-Second Generation Terrestrial (DVB-T2) transmission system,
wherein the first frame is a T2 frame, and the second frame is a T2-Lite frame.

9. A method of controlling a transmitting apparatus, comprising:
   generating a first frame comprising first service data to be decoded at a fixed terminal and a second frame comprising second service data to be decoded at a mobile terminal, the second frame comprising common service data commonly provided for the fixed terminal and the mobile terminal;
   inserting access information on the common service data into a signaling area of the first frame; and
   transmitting the first and second frames.

10. The method of claim 9, wherein the access information is used to access the common service data through a signaling area of the second frame.

11. The method of claim 10, wherein the access information comprises identification information on the common service data and location information on the common service data, and
   wherein the signaling area of the second frame comprises comprising signal processing information on the common service data.

12. The method of claim 11, wherein the signal processing information comprises comprising at least one of forward error correction information and modulation method information.

13. The method of claim 9, wherein the access information is used to directly access the common service data.

14. The method of claim 13, wherein the access information comprises comprising identification information on the common service data, location information on the common service data, and signal processing information on the common service data.

15. The method of claim 13, wherein the access information is included in at least one of a signaling area of the first frame and a signaling area of the second frame.

16. The method of claim 9, wherein the transmitting apparatus is a Digital Video Broadcasting-Second Generation Terrestrial (DVB-T2) transmission system,
   wherein the first frame is a T2 frame, and the second frame is a T2-Lite frame.

* * * * *